United States Patent [19]
Chisholm

[11] Patent Number: 5,312,508

[45] Date of Patent: May 17, 1994

[54] ATTACHING CRIMPED WIRE MESH TO AN OBJECT REQUIRING HEAT TRANSFER

[76] Inventor: John Chisholm, 9337 S.E. River Ter., Jupiter, Fla. 33469

[21] Appl. No.: 971,994

[22] Filed: Oct. 16, 1992

[51] Int. Cl.$^5$ ................................. B32B 3/28
[52] U.S. Cl. ........................... 156/292; 156/153
[58] Field of Search ............... 156/210, 153, 292

[56] References Cited

PUBLICATIONS

"Adhesivers Handbook", Shields, J., CRC Press, 1970, pp. 235-237.

Primary Examiner—Michael W. Ball
Assistant Examiner—Francis J. Lorin

[57] ABSTRACT

The disclosure describes a method of attachment of a corrugated wire mesh having a plurality of wire bends to a substrate. In the method, flats are formed at the bends, and the flats are lightly coated with a thermosetting adhesive. And in a subsequent clamping operation, the adhesive is displaced from the interface of contact between the wire and substrate, thereby displacing the adhesive to the adjacent interstices. This leaves the mesh and substrate in direct thermal contact without a distinct layer of adhesive separating them.

1 Claim, 2 Drawing Sheets

ATTACHING CRIMPED WIRE MESH TO AN OBJECT REQUIRING HEAT TRANSFER

This procedure is directed toward elimination of a problem which exists with conventional extruded or stamped heat sinks and which are attached to their heat sources by thermally conductive adhesives. In such sinks the entire interface area between the sink and its heat source is coated with conductive adhesive. The problem arises from the fact that the adhesives, while excellent bonding agents, are relatively poor thermal conductors, thereby creating an inefficient thermal connection between the sink and its thermal package.

The procedure describes an attachment process for an alternate sink design which circumvents the indicated problem. Crimped wire mesh sinks offer such an advantage because their interface areas come into direct contact with their heat source envelopes, thereby minimizing the thermal resistance between the sink and its electronic package.

CROSS REFERENCE TO RELATED APPLICATIONS

This process is directly applicable to corrugated meshes made in accordance with U.S. Pat. No. 4843693 (Chisholm) claims 6 & 7. The primary advantage of both claims is improved heat transfer from components of electronic circuit boards and newer types of devices such as ASICS (Application Specific Integrated Circuits). However, the field is so broad there is much further probable application.

BACKGROUND OF THE INVENTION

1. Field of the Invention

The subject of the invention is an improved process for attaching wire mesh or corrugated wire mesh sinks to electronic packages for heat transfer purposes. Both of these afore types of wire sinks offer attachment advantages over established materials and techniques.

2. Description of the Prior Art

The prior art is a well established process which uses various epoxy compounds sandwiched between the sink and its heat source for sink attachment. The problem results from the fact that the epoxy is a poor thermal conductor (even with metal additives) and heat transfer is limited by this condition.

The conventional sink is usually an extruded, or stamped, or machined metal part with flat surfaces for attachment. One of the surfaces is designated an attachment surface and it is "buttered" with adhesive and affixed to the object requiring heat transfer. The flat surfaces are pressed together with a weight or clamp. The unit pressure (lbs/in$^2$) is low because of the fairly large size of the attachment area. As a result there is often some degree of air gap in the finished assembly. The intent of the subject invention is to describe a process on which the unit pressure and resulting quality of contact will be greater due to the smaller areas involved in the process.

SUMMARY

The invention is a process for attaching certain types of wire mesh sinks to electronic packages by using thermally setting adhesives. Two types of sinks are illustrated in the drawings, see FIG. 1 and FIG. 2. The distinguishing detail is that FIG. 2 has a wire mesh base attached to the corrugated troughs. The base affords an increased area of contact over that of the troughs alone. The base attachment may be made by brazing, soldering or other means 3, FIG. 2.

The subtlety of the process lies in the nature of the sink attachment. When the wire mesh and semiconductor package are pressed together for curing, the adhesive is displaced (squeezed out) from the contact area between the two surfaces thereby forming a series of islets (of Cu) and bridges (of adhesive) along the edges of the contact line between the mesh and package. The resulting islets are largely free of the insulative effects of the adhesive thereby creating a more favorable thermal path between the sink and its heat source.

A primary advantage of this procedure is that it allows direct application of a simple corrugated wire mesh sink such as is shown in FIG. 1. Other advantages include economy of manufature and universality of form. In application the corrugated mesh could be stocked in standard widths and cut off to suit particular length requirements.

BRIEF DESCRIPTION OF THE DRAWINGS

In the drawings I have shown two forms of corrugated wire mesh sinks to which the procedure is applicable, FIGS. 1 & 2. Also shown is a blown-up view of the wire mesh showing the interface where thermal contact is made (FIG. 3) and finally, a quasi-assembly view of the various components required for the curing process, (FIG. 4).

PREFERRED EMBODIMENTS

The process of attaching wire mesh sinks to electronic packages by thermally conductive adhesives is similar to that used with the more conventional sinks composed of extruded or stamped aluminum. However, in the case of the mesh a comparatively small amount of adhesive is needed and care should be used to keep it confined to the interstices because of its unfavorable conductive qualities.

Thermal attachment can be made to a variety of materials comprising the heat source envelope. Materials may be as diverse as ceramic, metal or plastic. Each material has its unique thermal characteristics but the philosophy of attachment is the same for each, i.e. the adhesive must be displaced from the interfacral contact area.

Figure 1:
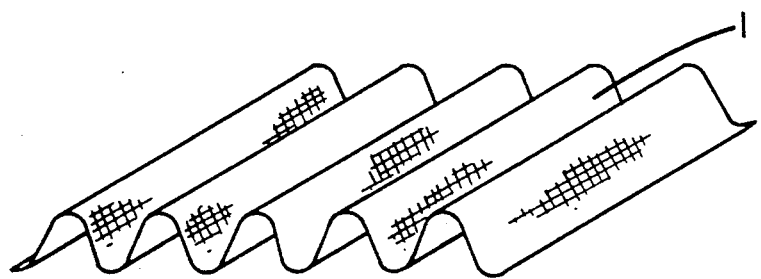
FIG. 1 is a fragmentary isometric view of the bare convoluted wire mesh.
Figure 2:
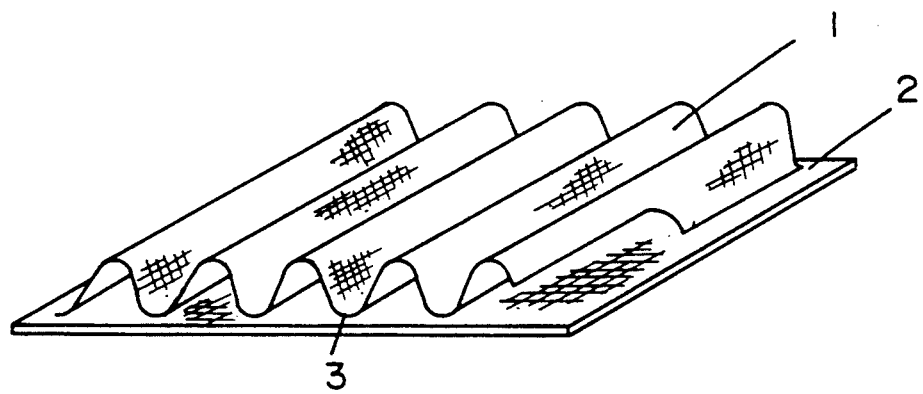
FIG. 2 is a sectioned, fragmentary, isometric view of convoluted wire mesh attached to a second piece of flat wire mesh.
Figure 3A:
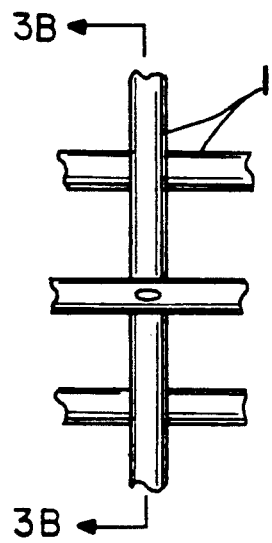
FIG. 3A is a blown-up and sectioned plan view of a double crimped wire mesh showing the abraded (or flattened) interface area.
Figure 3B:
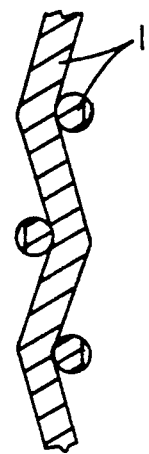
FIG. 3B is a sectioned elevation view of FIG. 3A

The interface between the mesh and device package is a series of wire islets. To maximize the contact area between the mating surfaces, the wire may be abraded on the wire islet surface, (see FIG. 3A & B). An alternative to abrading is flattening. In either case, the material thickness should not be reduced by more than a few thousandths of an inch.

Cleanliness is important in bonding materials. The circuit package and wire mesh must be clean and free of dust. It is advisable to store clean components in sealed plastic containers until time of assembly.

The adhesive ideally should be dispensed in a fine line of dots on the appropriate islets. Dispensing may be done with an artists brush or a commercial dispenser system. In some cases, depending on the wetting characteristics, the adhesive should be applied to both the mesh and the package. In all cases a small line of dots is desirable.

Figure 4:
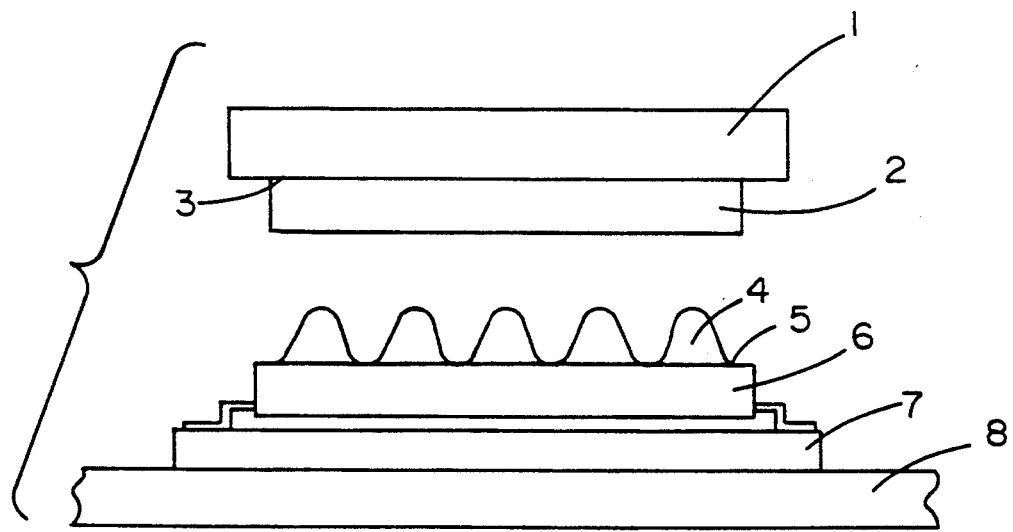
FIG. 4 is an elevation view of the arrangement of parts prior to the curing process.

In those cases where the mesh is very fine, an alternative to dispensing is "anointment-by-dipping" in which the sink is placed on a plate which is spread with a controled height of adhesive. The adhesive will adhere to the islets on lifting. The mesh and semiconductor package are pressed together such that the adhesive is forced out of the line of contact under pressure. The various components of the curing process are shown in FIG. 4.

1 is a weight (or clamp)
2 is a dense rubber pad
3 is a rubber adhesive
4 is the corrugated mesh
5 is the thermal adhesive
6 is the heat source
7 is a flat metal plate
8 is a work table The mesh and semiconductor package are pressed or clamped together such that the adhesive is forced out of the interface area under pressure. The adhesive is redeposited at the wire edges and its presence there will bridge the mating surface between the islets and the heat source. This leaves the mesh and package in direct thermal contact. After curing, the bridge holds the sink and package in a fixed and stressed relationship.

The time required for curing is a function of the temperature and can be varied from 30 minutes to a full day. Some thermal adhesives may also require a post cure.

I claim as new and desire to secure by Letters Patent of the United States:

1. The process of making a heat sink by attaching a corrugated wire mesh to a heat dissipating surface using a thermosetting adhesive, wherein the wire mesh comprises a woven web of wire, each wire having a generally circular cross section and forming a plurality of bends; cleaning those surfaces of the bend portion forming the mesh which comes in contact with the heat dissipating surface and the corresponding mating area of the dissipating surface which defines the interface area of the mesh; forming a slight flat on the contact area of the mesh whereby the flat is parallel to the heat dissipating surface; dispensing a small amount of adhesive on the cleaned interfaces; assembling the components and clamping them together such that the adhesive is largely displaced and squeezed out from the mesh interface and deposited in the mesh intersticies leaving the mesh wire bend and the mating area of the heat source in good thermal contact and curing the clamped assembly in a suitable oven.

* * * * *